United States Patent
Omoto et al.

(10) Patent No.: US 8,559,553 B2
(45) Date of Patent: Oct. 15, 2013

(54) TRANSMITTER APPARATUS

(75) Inventors: Yukihiro Omoto, Nara (JP); Kaoru Ishida, Kanagawa (JP); Hiroshi Komori, Shiga (JP)

(73) Assignee: Panasonic Corporation, Osaka (JP)

( * ) Notice: Subject to any disclaimer, the term of this patent is extended or adjusted under 35 U.S.C. 154(b) by 72 days.

(21) Appl. No.: 13/391,704

(22) PCT Filed: Apr. 7, 2010

(86) PCT No.: PCT/JP2010/002553
§ 371 (c)(1),
(2), (4) Date: Feb. 22, 2012

(87) PCT Pub. No.: WO2011/024342
PCT Pub. Date: Mar. 3, 2011

(65) Prior Publication Data
US 2012/0163500 A1    Jun. 28, 2012

(30) Foreign Application Priority Data

Aug. 26, 2009  (JP) ................................ 2009-195852

(51) Int. Cl.
*H04L 27/12* (2006.01)
*H04L 27/00* (2006.01)

(52) U.S. Cl.
USPC .......................................... 375/302; 375/295

(58) Field of Classification Search
USPC ......... 375/302, 130, 295, 298, 300; 455/67.3, 455/302, 311; 327/109
See application file for complete search history.

(56) References Cited

U.S. PATENT DOCUMENTS

| | | | |
|---|---|---|---|
| 8,254,496 B2* | 8/2012 | Takahashi | 375/297 |
| 2004/0036530 A1 | 2/2004 | Matsuura et al. | |
| 2004/0071225 A1 | 4/2004 | Suzuki et al. | |
| 2009/0011723 A1 | 1/2009 | Inamori et al. | |
| 2012/0140852 A1* | 6/2012 | Kato et al. | 375/298 |

FOREIGN PATENT DOCUMENTS

| | | |
|---|---|---|
| JP | 2004-48703 | 2/2004 |
| JP | 2004-104194 | 4/2004 |
| JP | 2007-228244 | 9/2007 |
| JP | 2009-17028 | 1/2009 |
| WO | 2008/044284 | 4/2008 |

OTHER PUBLICATIONS

International Search Report issued May 11, 2010 in corresponding International Application No. PCT/JP2010/002553.

\* cited by examiner

*Primary Examiner* — Khai Tran
(74) *Attorney, Agent, or Firm* — Wenderoth, Lind & Ponack, L.L.P.

(57) ABSTRACT

Provided is a transmitter apparatus including: a signal conversion section for, in polar modulation, converting input data into an amplitude-component signal and a phase-component signal, and in quadrature modulation, converting input data into an in-phase component signal and a quadrature component signal; a carrier wave generation section for outputting a carrier wave; a mixer section for, in quadrature modulation, generating a quadrature modulation signal; a regulator for, in polar modulation, outputting a supply voltage control signal; and a power amplifier for, in polar modulation, amplifying the supply voltage control signal and superimposing the resultant signal onto the carrier wave, thereby generating a transmission signal, wherein in polar modulation, the carrier wave generation section outputs the carrier wave modulated with respect to phase component, and in quadrature modulation, the carrier wave generation section outputs the carrier wave that is yet to be modulated.

7 Claims, 7 Drawing Sheets

TRANSMITTER APPARATUS

TECHNICAL FIELD

The present invention relates to the configuration of a transmitter circuit used in a wireless communication system such as a mobile phone or a wireless LAN. More specifically, the present invention relates to a transmitter circuit that operates with small current consumption and is small in its circuit scale.

BACKGROUND ART

As an example of conventional transmitter circuits, a transmitter circuit that generates a transmission signal by using a quadrature modulation method is known. Since such transmitter circuits using the quadrature modulation method are widely known, the description thereof will be omitted. In addition, as an example of conventional transmitter circuits that operate more efficiently than the circuits using the quadrature modulation method, an EER modulation circuit using an EER (Envelope Elimination and Restoration) modulation method is known. In the EER modulation method, an input signal is divided into a phase-component signal and an amplitude-component signal. First, an oscillation signal generated by an oscillator is multiplied by the phase-component signal, whereby a phase-modulated signal having a constant amplitude is generated. Next, by using a saturation amplifier, the amplitude-component signal is amplified and superimposed onto the phase-modulated signal, whereby a transmission signal is generated.

In the EER modulation method, there is a feature that a saturation amplifier is used when the amplitude component is superimposed onto the phase-modulated signal. Since the saturation amplifier is operated in a saturation region, a transmission signal can be generated with high power efficiency.

However, in the EER modulation method, when the output level of a transmission signal is low, the amplifier operates outside the saturation region, whereby power efficiency decreases, or the proportion of power consumption of an amplitude modulation section to power consumption of the entirety of the transmitter becomes large, whereby power efficiency decreases. Therefore, conventionally, there has been proposed a transmitter circuit that linearly operates the amplifier, using the EER modulation method for high level of output and using the quadrature modulation method for low level of output, thereby improving power efficiency. For example, Patent Literature 1 discloses a transmitter circuit 600 shown in FIG. 7. Hereinafter, the configuration and the operation of the transmitter circuit 600 will be described.

An in-phase component signal (I-signal) and a quadrature component signal (Q-signal), which are signals for the quadrature modulation method, are inputted from a baseband section 601 to an interface section 602. An Rθ conversion section 604 in the interface section 602 switches a modulation method between the quadrature modulation method and the EER modulation method, based on an AGC control signal from the baseband section 601. In the quadrature modulation method, the Rθ conversion section 604 outputs the I-signal and the Q-signal as they are, without performing signal processing, and in the EER modulation method, the Rθ conversion section 604 performs processing of converting the I-signal and the Q-signal into an amplitude-component signal and a phase-component signal (Rθ conversion processing). The Rθ conversion processing is performed by extraction of phase information by a limiter, and envelope detection.

In the quadrature modulation method, the I-signal is inputted to a DAC 605, and in the EER method, the phase-component signal is input to the DAC 605. In addition, in the quadrature modulation method, the Q-signal is inputted to a DAC 606, and in the EER method, the amplitude-component signal is inputted to the DAC 606. An output from the DAC 605 is inputted to a mixer 621 via a baseband filter 625.

In the quadrature modulation method, a switch 607 connects the output of the DAC 606 to a Q-component baseband filter 608 in an RF-IC 603, and in the EER modulation method, the switch 607 connects the output of the DAC 606 to an amplitude modulation circuit 609.

In the quadrature modulation method, a switch 610 connects the sum of the I-signal and the Q-signal to an AGC amplifier 611, and in the EER modulation method, the switch 610 connects only the phase-component signal to the AGC amplifier 611. In the quadrature modulation method, a switch 612 connects the output of the AGC amplifier 611 to an output buffer 613, thereby transmitting an output from the AGC amplifier 611, to an front end not via a power amplifier 614, and in the EER modulation method, the switch 612 connects the output of the AGC amplifier 611 to the power amplifier 614, thereby amplifying an output from the AGC amplifier 611.

In the quadrature modulation, an input signal is converted into the I-signal and the Q signal. An oscillation signal generated by an oscillator 620 is distributed into two lines by a phase shifter 623. One of the two signals is outputted to the mixer 621 without shifting the phase of the signal, and the mixer 621 multiplies the signal by the I-signal outputted from the baseband filter 625. The other one of the two signals is outputted to a mixer 622 after the phase of the signal is shifted, and the mixer 622 multiplies the signal by the Q-signal outputted from the baseband filter 608. Thereafter, the signals which have been respectively multiplied by the I-signal and the Q-signal are synthesized by the adder 624, whereby a modulated wave based on the quadrature modulation method is obtained. In the EER modulation method, an input signal is converted into the amplitude-component signal and the phase-component signal. First, an oscillation signal generated by the oscillator 620 is multiplied by the phase-component signal, whereby a phase-modulated signal is generated. Thereafter, the amplitude-component signal is amplified and superimposed onto the phase-modulated signal by the power amplifier 614, whereby a modulated wave based on the EER modulation method is obtained. That is, the transmitter circuit switches the modulation method such that if the voltage level of a signal is smaller than a predetermined value, the quadrature modulation is performed, and if the voltage level is larger than the predetermined value, the EER modulation is performed. In this way, the conventional transmitter circuit uses the quadrature modulation method and the EER modulation method in a combined manner, thereby realizing reduction in the power consumption.

CITATION LIST

Patent Literature

[PTL 1] Japanese Patent No. 3979237

SUMMARY OF THE INVENTION

Problems to be Solved by the Invention

However, the phase-modulated signal is strictly required to have a low-noise characteristic. Therefore, in the case where the phase-modulated signal is generated by using the mixer 621 as in the conventional transmitter circuit 600, the mixer 621 having high performance which is excellent in low-noise characteristic needs to be used. Such a mixer having a low-noise characteristic has high device requirements. Therefore, in general, the circuit scale increases. Moreover, even if the mixer 621 having a low-noise characteristic is used, it is impossible to completely eliminate noise. Therefore, actually, it is necessary to connect an image eliminating filer, which is not shown in FIG. 7, to the output of the mixer 621, thereby eliminating noise.

As described above, the circuit scale of the conventional transmitter circuit 600 is large because the mixer 621 having high performance and the image eliminating filter are needed, and therefore, there is a limit to improvement in power consumption. Especially in the case of low level of output, the proportion of the power consumption of the power amplifier 614 to the power consumption of the entirety of the transmitter circuit is small. Therefore, even if the power consumption of the power amplifier 614 is reduced by switching the modulation method, this hardly reduces the power consumption of the entirety of the transmitter circuit 600.

Therefore, an object of the present invention is to reduce the circuit scale of a transmitter circuit switching a modulation method, and reduce power consumption of the entirety of the circuit, without reducing the quality of a transmission signal.

Solution to the Problems

To achieve the above objects, the first aspect of the present invention is a transmitter circuit that performs two modulation methods of a polar modulation method and a quadrature modulation method, and generates a transmission signal by a designated modulation method, the transmitter circuit comprising: a signal conversion section for, in the polar modulation method, converting input data into an amplitude-component signal and a phase-component signal, and in the quadrature modulation method, converting input data into an in-phase component signal and a quadrature component signal; a carrier wave generation section for outputting a carrier wave corresponding to a designated modulation method; a mixer section for, in the quadrature modulation method, generating a quadrature modulation signal from the carrier wave, the in-phase component signal, and the quadrature component signal; a regulator for, in the polar modulation method, outputting a supply voltage control signal in accordance with the amplitude-component signal; and a power amplifier for, in the polar modulation method, amplifying the supply voltage control signal and superimposing the resultant signal onto the carrier wave, thereby generating the transmission signal, and for, in the quadrature modulation method, amplifying the quadrature modulation signal, thereby generating the transmission signal. In the polar modulation method, the phase-component signal is inputted to the carrier wave generation section, and the carrier wave generation section outputs the carrier wave that has been modulated with respect to phase component. In the quadrature modulation method, the carrier wave generation section outputs the carrier wave that is yet to be modulated.

According to the second aspect of the present invention based on the first aspect, the carrier wave generation section includes: an oscillation section for generating an oscillation signal corresponding to the designated modulation method; a phase shifter for, in the quadrature modulation method, distributing and phase-shifting the oscillation signal, and outputting the resultant signals as the carrier wave that is yet to be modulated, to the mixer section; and a switch for, in the polar modulation method, outputting the oscillation signal as the carrier wave that has been modulated with respect to phase component, to the power amplifier, and for, in the quadrature modulation method, connecting the oscillation signal to the phase shifter. The oscillation section includes: an oscillator for, in the polar modulation method, generating a high-frequency signal that has been modulated with respect to phase component, based on the phase-component signal inputted to the carrier wave generation section, and for, in the quadrature modulation method, generating a high-frequency signal that is yet to be modulated; and a frequency divider having respective frequency division characteristics corresponding to the polar modulation method and the quadrature modulation method, and the frequency divider switches the frequency division characteristic in accordance with the designated modulation method and frequency-dividing the high-frequency signal, thereby generating the oscillation signal.

According to the third aspect of the present invention based on the first aspect, the carrier wave generation section includes an oscillation section for generating the carrier wave corresponding to the designated modulation method. In the quadrature modulation method, the carrier wave generation section outputs the carrier wave to the mixer section, and in the polar modulation method, the carrier wave generation section outputs the carrier wave to the power amplifier. The oscillation section includes: an oscillator for, in the polar modulation method, generating a high-frequency signal that has been modulated with respect to phase component, based on the phase-component signal inputted to the carrier wave generation section, and for, in the quadrature modulation method, generating a high-frequency signal that is yet to be modulated; a first frequency divider having a frequency division characteristic corresponding to the polar modulation method; and a second frequency divider having a frequency division characteristic corresponding to the quadrature modulation method, a distribution function, and a phase shifting function. The first frequency divider, in the polar modulation method, frequency-divides the high-frequency signal, thereby generating the carrier wave that has been modulated with respect to phase component, and in the quadrature modulation method, does not operate. The second frequency divider, in the quadrature modulation method, frequency-divides the high-frequency signal, distributes and phase-shifts the resultant signal, thereby generating the carrier wave that is yet to be modulated, and in the polar modulation method, does not operate.

According to the fourth aspect of the present invention based on the third aspect, the transmitter circuit is a multiband supporting transmitter circuit for generating a transmission signal while switching a band among a plurality of predetermined bands, in accordance with a designation. The carrier wave generation section includes a plurality of the oscillation sections which output the carrier waves respectively corresponding to the plurality of bands. Of the plurality of the oscillation sections, the oscillation section that corresponds to a designated band outputs the carrier wave, and the oscillation sections that do not correspond to the designated band do not output the carrier waves.

According to the fifth aspect of the present invention based on the fourth aspect, whether or not to output the carrier wave from each of the plurality of oscillation sections is controlled by supply or shutoff of power to the first frequency divider and the second frequency divider included in each of the plurality of oscillation sections.

The sixth aspect of the present invention is a communication apparatus comprising: the transmitter circuit according to any one of claims 1 to 5, which generates a transmission signal; and an antenna for outputting the transmission signal generated by the transmitter circuit.

According to the seventh aspect of the present invention based on the sixth aspect, the communication apparatus further comprises: a receiver circuit for processing a reception signal received from the antenna; and an antenna duplexer section for outputting the transmission signal generated by the transmitter circuit to the antenna, and outputting the reception signal received from the antenna, to the receiver circuit.

Advantageous Effects of the Invention

According to the present invention, it becomes possible to realize a transmitter circuit, switching a modulation method, that has a small circuit scale, without reducing the quality of a transmission signal, thereby reducing the power consumption and the cost of the transmitter circuit or a communication apparatus including the transmitter circuit.

DESCRIPTION OF EMBODIMENTS

First Embodiment

Hereinafter, the first embodiment of the present invention will be described. First, a polar modulation method used in the present embodiment will be described. In the EER modulation method used in the conventional transmitter circuit 600, an oscillation signal outputted by an oscillator is multiplied by a phase-component signal, whereby a phase-modulated signal is generated. Instead, a phase-component signal is inputted to an oscillator, and an oscillation signal including the phase component is directly outputted from the oscillator, whereby a phase-modulated signal can be generated. As used herein, an EER modulation method using this way of generating the phase-modulated signal instead of using the conventional way is, in particular, referred to as a polar modulation method.

Figure 1:
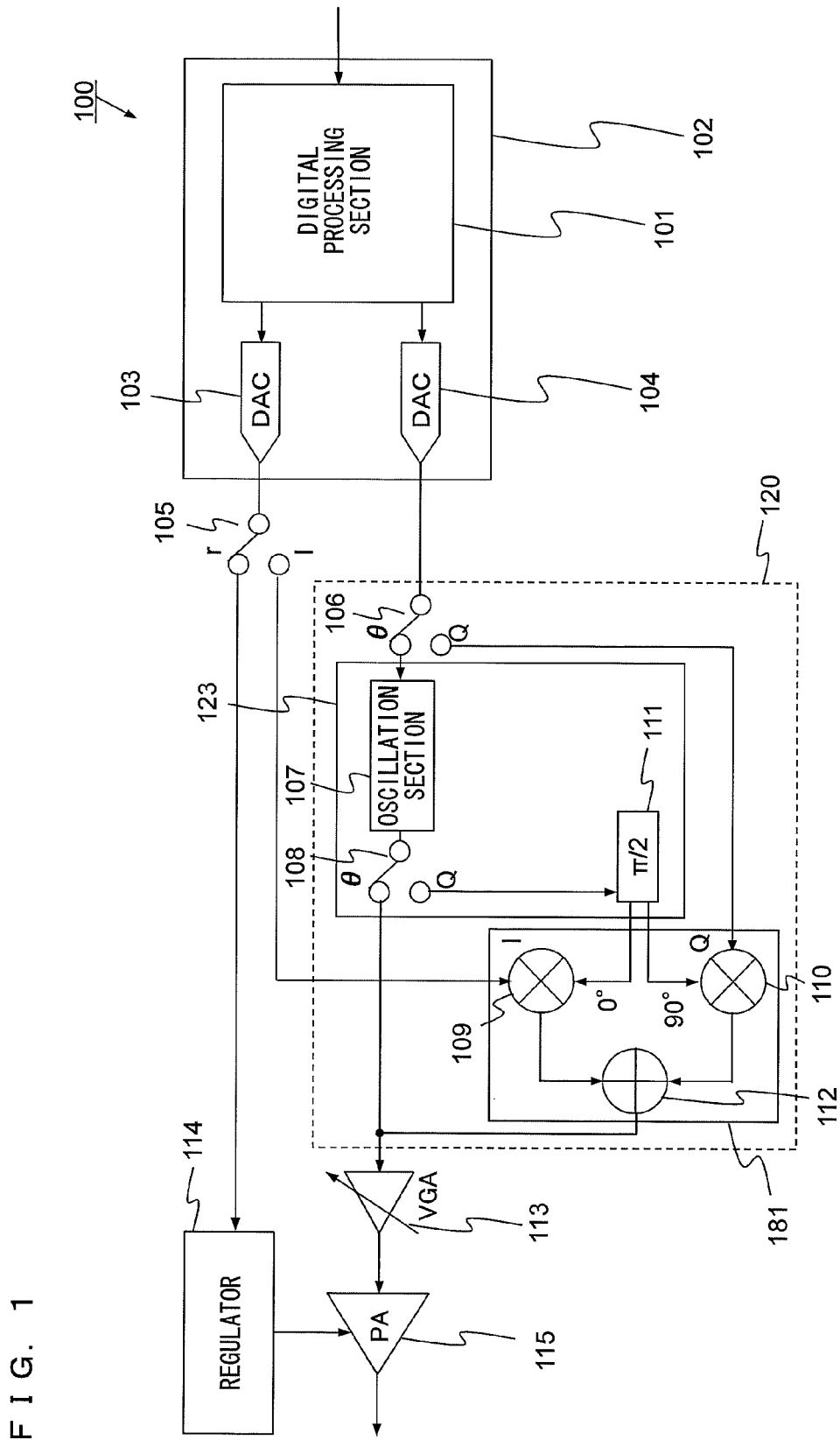
FIG. 1 shows the configuration of a transmitter circuit according to the first embodiment of the present invention.

FIG. 1 shows a transmitter circuit 100 according to the present embodiment. With reference to FIG. 1, the transmitter circuit 100 includes a signal conversion section 102, a carrier wave generation section 123, a mixer section 181, a regulator 114, a VGA (variable gain amplifier) 113, and a power amplifier 115. The transmitter circuit 100 switches a modulation method between two types, i.e., the quadrature modulation method and the polar modulation method, in accordance with an instruction from the outside. Examples of instructions from the outside include an instruction from a base station. For example, in the case where a communication apparatus including the transmitter circuit 100 communicates with a base station, if the communication condition is bad, the base station can transmit an instruction to increase the output level of a transmission signal, to the communication apparatus. The communication apparatus sends the instruction to the transmitter circuit 100 inside the communication apparatus. In accordance with the instruction, if the output level designated by the instruction is higher than a predetermined threshold value, the transmitter circuit can increase the output level by switching the modulation method from the quadrature modulation method to the polar modulation method. On the other hand, if the output level designated by the instruction is lower than the predetermined threshold value, the transmitter circuit can decrease the output level by switching the modulation method from the polar modulation method to the quadrature modulation method.

An input signal is inputted to the signal conversion section 102. When a digital processing section 101 in the signal conversion section 102 has received the instruction to change the output level, the digital processing section 101 switches the modulation method between the quadrature modulation method and the polar modulation method at a timing corresponding to the boundary between unit communication times (time slots). In the case where the instruction is to decrease the output level, the digital processing section 101 converts the input signal into an in-phase component signal (I-signal) and a quadrature component signal (Q-signal) which are signals for the quadrature modulation method, and then outputs the I-signal and the Q-signal. In the case where the instruction is to increase the output level, the digital processing section 101 converts the input signal into an amplitude-component signal and a phase-component signal which are signals for the polar modulation method, and then outputs the amplitude-component signal and the phase-component signal. It is noted that in the case where there is no instruction from the outside, either one of the modulation methods that is set in advance may be used.

An output from the digital processing section 101 is inputted to DACs (digital analog converters) 103 and 104. In the quadrature modulation method, the I-signal is inputted to the DAC 103, and in the polar modulation method, the amplitude-component signal is input to the DAC 103. In addition, in the quadrature modulation method, the Q-signal is inputted to the DAC 104, and in the polar modulation method, the phase-component signal is input to the DAC 104. These inputted signals are converted into analog signals, and the converted signals are outputted to switches 105 and 106, respectively.

In the quadrature modulation method, the switch 105 connects the output of the DAC 103 to a mixer 109 (to I-side in FIG. 1), and in the polar modulation method, the switch 105 connects the output of the DAC 103 to the regulator 114 (to r-side in FIG. 1).

In the quadrature modulation method, the switch 106 connects the output of the DAC 104 to a mixer 110 (to Q-side in FIG. 1), and in the polar modulation method, the switch 106 connects the output of the DAC 104 to an oscillation section 107 in the carrier wave generation section 123 (to θ-side in FIG. 1). In the quadrature modulation method, a switch 108 in the carrier wave generation section 123 connects the output of the oscillation section 107 to a phase shifter 111 in the carrier wave generation section 123 (to Q-side in FIG. 1), and in the polar modulation method, the switch 108 connects the output of the oscillation section 107 to the VGA 113 (to θ-side in FIG. 1).

That is, in the case where the quadrature modulation method is designated, the signal conversion section 102 outputs the I-signal and the Q-signal. The I-signal and the Q-signal are converted into analog signals by the DACs 103 and 104, respectively, and then the converted signals are inputted to the mixers 109 and 110, respectively. The oscillation section 107 in the carrier wave generation section 123 outputs an oscillation signal to the phase shifter 111. The phase shifter 111 distributes the inputted oscillation signal into two lines. The phase shifter 111 outputs one of the two signals to the mixer 109 without shifting the phase of the signal. The phase shifter 111 shifts the phase of the other one of the two signals by 90 degrees, and outputs the resultant signal to the mixer 110. The mixers 109 and 110 multiply the inputted signals by the I-signal and the Q-signal, respectively, thereby generating an I-component modulation signal and a Q-component modulation signal, and outputs the I-component modulation signal and the Q-component modulation signal to an adder 112. The adder 112 combines the I-component modulation signal and the Q-component modulation signal to generate a quadrature modulation signal. In this way, the mixers 109 and 110, and the adder 112 compose a mixer section for generating a quadrature modulation signal from the carrier wave, the I-signal, and the Q-signal. The quadrature modulation signal is amplified by the VGA 113 in accordance with the transmission output level, and then is inputted to the power amplifier 115. The power amplifier 115 further amplifies the inputted quadrature modulation signal, thereby generating a transmission signal. It is noted that although the quadrature modulation signal is amplified by the VGA 113 and the power amplifier 115 here, the quadrature modulation signal may be amplified by only one of the VGA 113 and the power amplifier 115.

On the other hand, in the case where the polar modulation method is designated, the signal conversion section 102 outputs the amplitude-component signal and the phase-component signal. The amplitude-component signal and the phase-component signal are converted into analog signals by the DACs 103 and 104, respectively. The converted amplitude-component signal is inputted to the regulator 114, in which the amplitude-component signal is converted into a supply voltage control signal for the power amplifier 115, and the supply voltage control signal is inputted to the power amplifier 115. Meanwhile, the converted phase-component signal is inputted to the oscillation section 107 in the carrier wave generation section 123. The oscillation section 107 generates a phase-modulated signal including a phase component, based on the phase-component signal. The phase-modulated signal is amplified by the VGA 113 in accordance with the transmission output level, and then is inputted to the power amplifier 115. The power amplifier 115 amplifies the supply voltage control signal and superimposes the resultant signal onto the inputted phase-modulated signal, thereby generating a transmission signal. It is noted that the DACs 103 and 104 are shared both in the quadrature modulation method and in the polar modulation method, whereby the scale of the transmitter circuit is suppressed.

According to the present embodiment, the transmitter circuit 100 can switch the modulation method such that if the required output level of a transmission signal is low, the quadrature modulation is performed, and if the required output level is high, the polar modulation is performed. In this way, the quadrature modulation method and the polar modulation method are used in a combined manner, and if the required output level of a transmission signal is low, the operation of the regulator is stopped, using the quadrature modulation method, whereby the power consumption of the entirety of the transmitter circuit is reduced. In addition, in the transmitter circuit 100, in the polar modulation method, the oscillation section 107 directly generates the phase-modulated signal, based on the phase-component signal. Therefore, in the generation of the phase-modulated signal, it is not necessary to use the mixer, and it is not necessary to take measures for noise caused by the mixer, either. Therefore, it is possible to generate a phase-modulated signal having low noise without using a mixer having high performance that is excellent in low-noise characteristic or using an image eliminating filter. Therefore, it is possible to reduce the circuit scale in comparison with the conventional transmitter circuit and reduce the power consumption, without decreasing the quality of a transmission signal.

Second Embodiment

Figure 2:
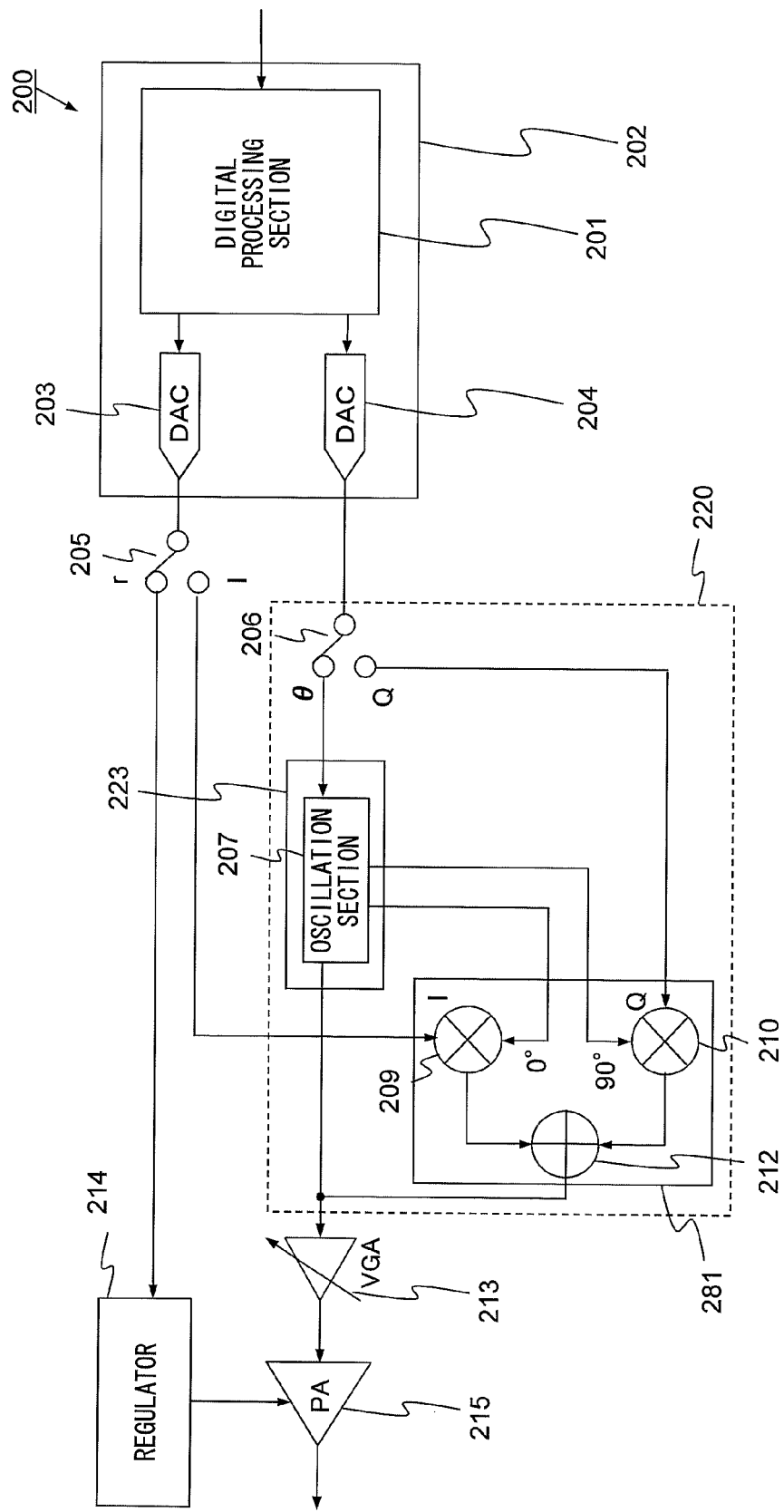
FIG. 2 shows the configuration of a transmitter circuit according to the second embodiment of the present invention.

Hereinafter, a transmitter circuit 200 according to the second embodiment of the present invention will be described with reference to FIG. 2 and FIG. 3. As shown in FIG. 2, the transmitter circuit 200 of the present embodiment is obtained by replacing the carrier wave generation section 123 in the transmitter circuit 100 according to the first embodiment with a carrier wave generation section 223.

Figure 3:
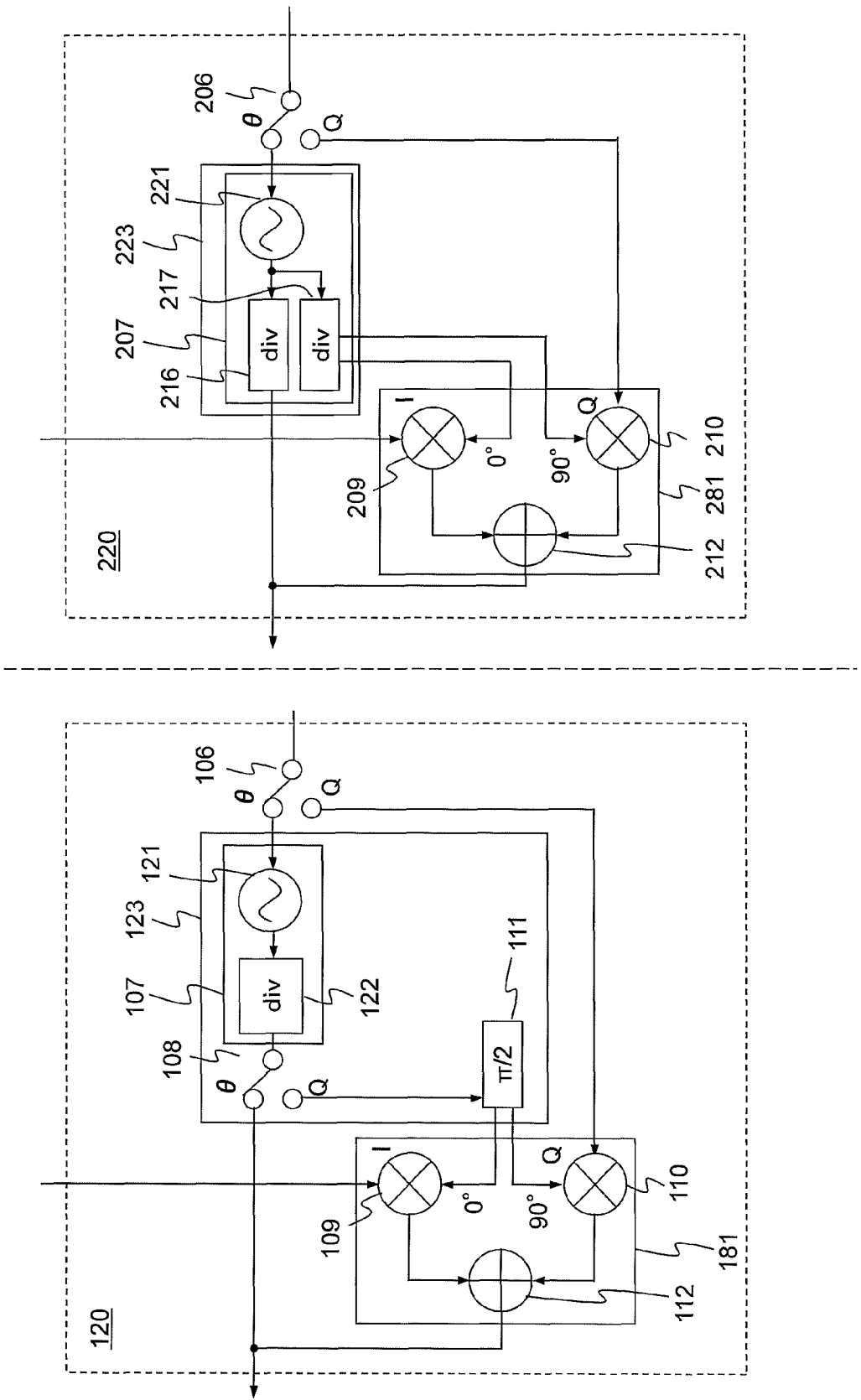
FIG. 3 shows the difference between the configurations of the transmitter circuit according to the first embodiment of the present invention and the transmitter circuit according to the second embodiment of the present invention.

FIG. 3 shows, side-by-side, a part 120 in the transmitter circuit 100 and a part 220 in the transmitter circuit 200 enclosed by dashed lines in FIG. 1 and FIG. 2, respectively, for the purpose of comparing the configurations of the carrier wave generation sections 123 and 223 with each other, in which the internal configurations of the oscillation section 107 and an oscillation section 207 are also shown.

In the transmitter circuit 100 of the first embodiment, the carrier wave generation section 123 includes the oscillation section 107, the switch 108, and the phase shifter 111. The oscillation section 107 includes an oscillator 121 and a frequency divider 122. The oscillator 121 generates a higher frequency than the frequency band of a transmission signal. The frequency of an output from the oscillator 121 is decreased by the frequency divider 122, whereby a carrier wave for modulation signal having a desired frequency is obtained. It is noted that conventionally, such a technique of, in the transmitter circuit, frequency-dividing an output from the oscillator to obtain a modulation wave having a desired frequency is generally used. The frequency divider 122 has respective frequency division characteristics corresponding to the quadrature modulation method and the polar modulation method, and performs frequency division processing, switching the frequency division characteristic in accordance with the modulation method. The destination of an output from the frequency divider 122 is switched by the switch 108 in accordance with the modulation method.

On the other hand, in the transmitter circuit 200 of the present embodiment, the carrier wave generation section 223 includes only the oscillation section 207. The oscillation section 207 includes an oscillator 221, and two frequency dividers 216 and 217. As in the oscillator 121, the oscillator 221 generates a higher frequency than the frequency band of a transmission signal. The frequency divider 216 has a frequency division characteristic corresponding to the polar modulation method. Only in the polar modulation method, the frequency divider 216 is supplied with power, and operates. The frequency divider 217 has a frequency division characteristic corresponding to the quadrature modulation method. Only in the quadrature modulation method, the frequency divider 216 is supplied with power, and operates. In addition, the frequency divider 217 also has a signal distributing function and a phase shifting characteristic, as part of the frequency division characteristic. The frequency divider 217 frequency-divides a signal from the oscillator 221, and then distributes the resultant signal into two lines. The frequency divider 217 outputs one of the two signals to a mixer 209 without shifting the phase of the signal. The frequency divider 217 shifts the phase of the other one of the two signals by 90 degrees, and outputs the resultant signal to a mixer 210. It is noted that conventionally, such a technique of providing the frequency divider with the signal distributing function and the phase shifting characteristic can be realized without cost.

The frequency dividers 216 and 217 are obtained by dividing the frequency divider 122 of the first embodiment and moving the function of the phase shifter 111 to one of them. The frequency divider 122 needs to have respective frequency division characteristics corresponding to the quadrature modulation method and the polar modulation method. The circuit scale of the sophisticated frequency divider 122 having such a wide range of frequency division characteristics is large. On the other hand, each of the frequency dividers 216 and 217 has only the frequency division characteristic corresponding to the modulation method that the frequency divider supports. Even the total circuit scale of the two frequency dividers is smaller than the circuit scale of the frequency divider 122 of the first embodiment. Therefore, the present embodiment can reduce the circuit scale in comparison with the first embodiment, thereby reducing the power consumption.

In addition, in the carrier wave generation section 223, the switch 108 is not needed, in comparison with the carrier wave generation section 123 of the first embodiment. Since the switch 108 is used for allowing a high-frequency signal to pass, the switch 108 needs to have a frequency characteristic that allows a high-frequency signal to pass, and therefore, the circuit scale thereof is large. In the present embodiment, supply of power to the frequency divider 216 or the frequency divider 217 is switched therebetween, whereby a function of a switch that allows a high-frequency signal to pass is realized, and the switch 108 is not needed. Therefore, the cost can be reduced, and the power consumption is reduced.

It is noted that the carrier wave generation section 223 needs to include a circuit (not shown) for switching supply of power to the frequency divider 216 or 217 therebetween. However, unlike the switch 108, the circuit for switching is not a circuit for allowing a high-frequency signal to pass, and therefore, the circuit does not need to have a high function. The scale of the circuit is equal to or smaller than that of a circuit (not shown), included in the carrier wave generation section 123, for instructing the frequency divider 122 to make switching in accordance with the modulation method in the first embodiment. Therefore, the circuit does not contribute to increase in the circuit scale or the cost, in comparison with the first embodiment.

Third Embodiment

Figure 4:
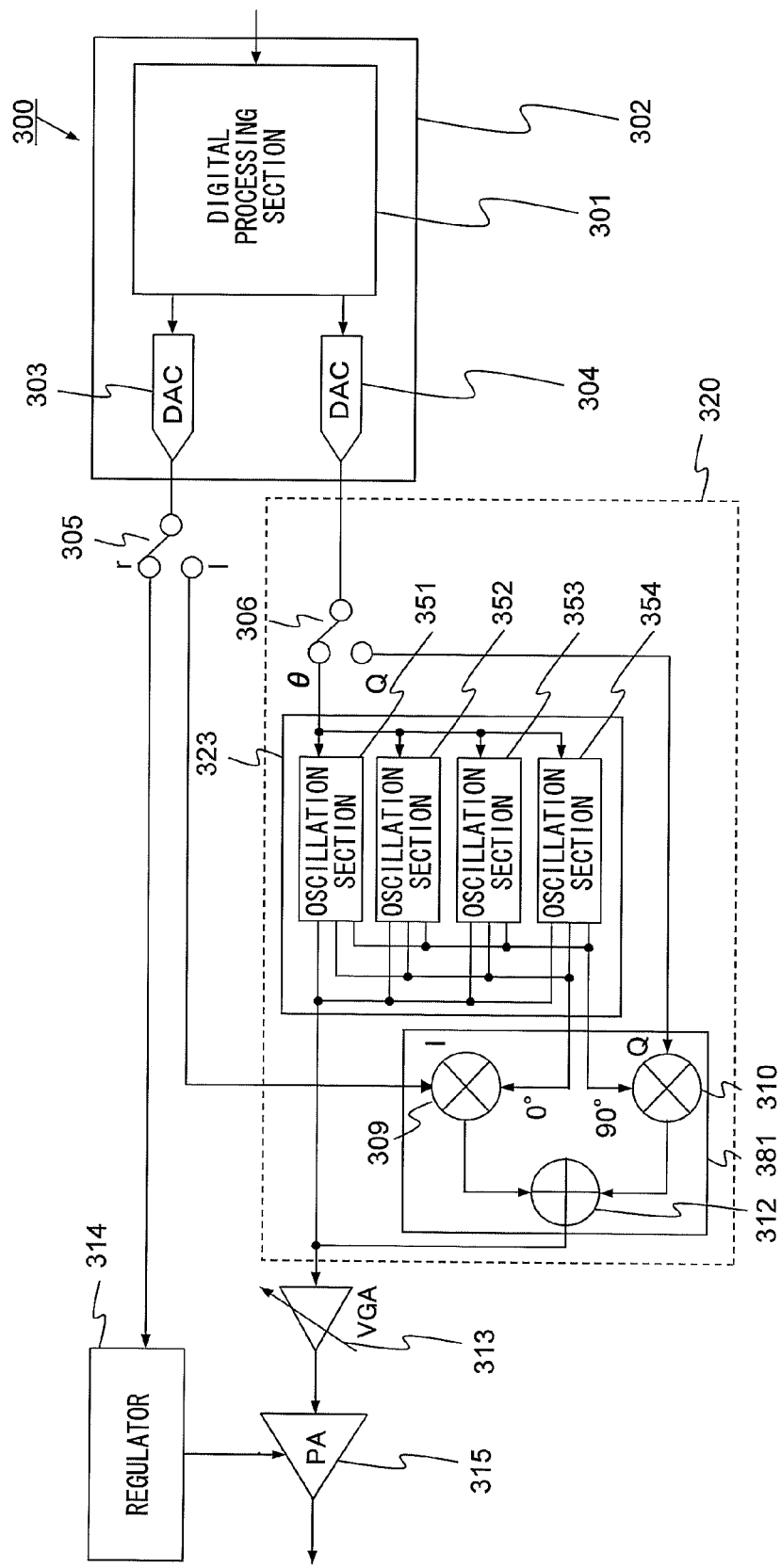
FIG. 4 shows the configuration of a transmitter circuit according to the third embodiment of the present invention.

Hereinafter, a transmitter circuit 300 according to the third embodiment of the present invention will be described with reference to FIG. 4 and FIG. 5. As shown in FIG. 4, in the present embodiment, a carrier wave generation section 323 is provided in place of the carrier wave generation section 123 of the first embodiment. The carrier wave generation section 323 includes four oscillation sections 351, 352, 353, and 354. The four oscillation sections output respective carrier waves having different frequency bands. That is, the transmitter circuit 300 support a multiband mode.

Figure 5:
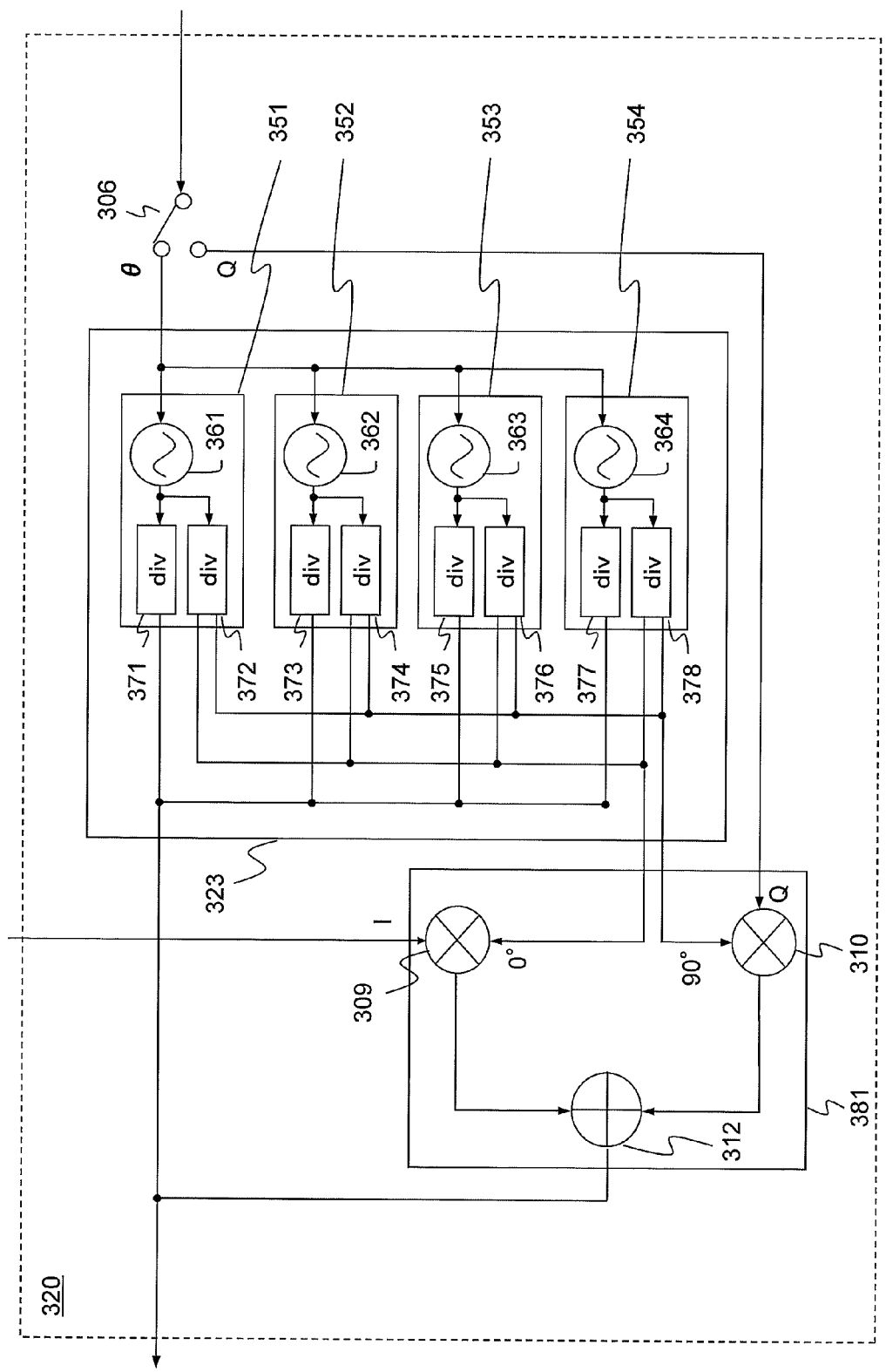
FIG. 5 shows the configuration of the transmitter circuit according to the third embodiment of the present invention.

FIG. 5 shows a part 320 enclosed by dashed line in FIG. 4. In FIG. 5, the internal configurations of the oscillation sections 351, 352, 353, and 354 are also shown. The oscillation section 351 includes an oscillator 361, a first frequency divider 371, and a second frequency divider 372. Similarly, the oscillation section 352 includes an oscillator 362, a first frequency divider 373, and a second frequency divider 374. The oscillation section 353 includes an oscillator 363, a first frequency divider 375, and a second frequency divider 376. The oscillation section 354 includes an oscillator 364, a first frequency divider 377, and a second frequency divider 378. For example, the oscillation sections 351, 352, 353, and 354 respectively support a high-frequency band of 1.9 GHz band, a medium-frequency band of 1.5 GHz band, a low-frequency band of 900 MHz band of a UMTS, and a band of a GSM/EDGE.

For example, in the case where a high-frequency band of the UMTS method is designated, a carrier wave outputted by the oscillation section 351 is used. In the polar modulation method, the first frequency divider 371 frequency-divides an oscillation signal outputted by the oscillator 361, while supply of power to the second frequency divider 372 is stopped and the second frequency divider 372 stops its operation. In the quadrature modulation method, the second frequency divider 372 frequency-divides an oscillation signal outputted by the oscillator 361, while supply of power to the first frequency divider 371 is stopped and the first frequency divider 371 stops its operation. In addition, at this time, supply of power to the other oscillation sections 352, 353, and 354 is stopped, and their operations are stopped. Therefore, the other oscillation sections 352, 353, and 354 do not output carrier waves. In this case, only supply of power to the frequency dividers 373, 374, 375, 376, 377, and 378 which are the frequency dividers in the other oscillators may be stopped. In this way, in the case where only the operations of the frequency dividers in the other oscillators are stopped, since the operations of the other oscillators themselves continue, variation in the oscillation frequencies due to intermittent oscillation can be suppressed. Therefore, even if a band is frequently switched, it is possible to suppress reduction of the quality of a transmission signal.

Thus, the circuit scale of the transmitter circuit supporting a multiband mode is larger than the circuit scale of the transmitter circuit for a single band as in the second embodiment. However, in comparison among such transmitter circuits supporting a multiband mode, since in the present embodiment, each of the oscillation sections supporting the respective bands individually includes frequency dividers respectively corresponding to the quadrature modulation method and the polar modulation method, it is not necessary to provide a sophisticated frequency divider having a wide range of frequency division characteristics, and a switch for a high-frequency signal, i.e., the switch 108 of the first embodiment. Therefore, the circuit scale of the transmitter circuit of the present embodiment can be reduced.

In the present embodiment, the transmitter circuit 300 includes the four oscillation sections 351, 352, 353, and 354 which respectively support a high-frequency band of 1.9 GHz band, a medium-frequency band of 1.5 GHz band, a low-frequency band of 900 MHz band of the UMTS, and a band of the GSM/EDGE. However, the kinds or the number of supported bands are not limited thereto. The oscillation sections may support other kinds of bands or other number of bands.

As described above, according to the first to third embodiments, it is possible to provide a transmitter circuit, switching a modulation method between the quadrature modulation method and the polar modulation method, that has a reduced circuit scale, without reducing the quality of a transmission signal, thereby reducing the power consumption of the transmitter circuit.

In addition, in the first to third embodiments, since the regulators 114, 214 and, 314 are not used in the quadrature modulation method, supply of power to the regulators 114, 214, and 314 may be stopped when the quadrature modulation method is performed. In this way, the power consumption is further reduced.

Fourth Embodiment

Figure 6:
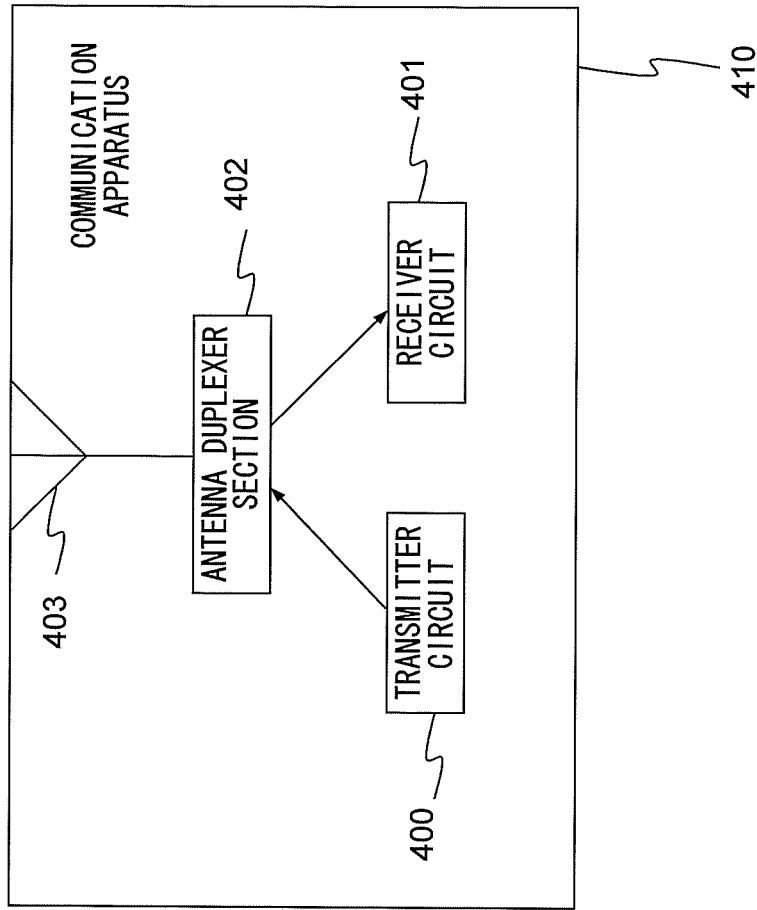
FIG. 6 shows the configuration of a communication apparatus according to the fourth embodiment of the present invention.
Figure 7:
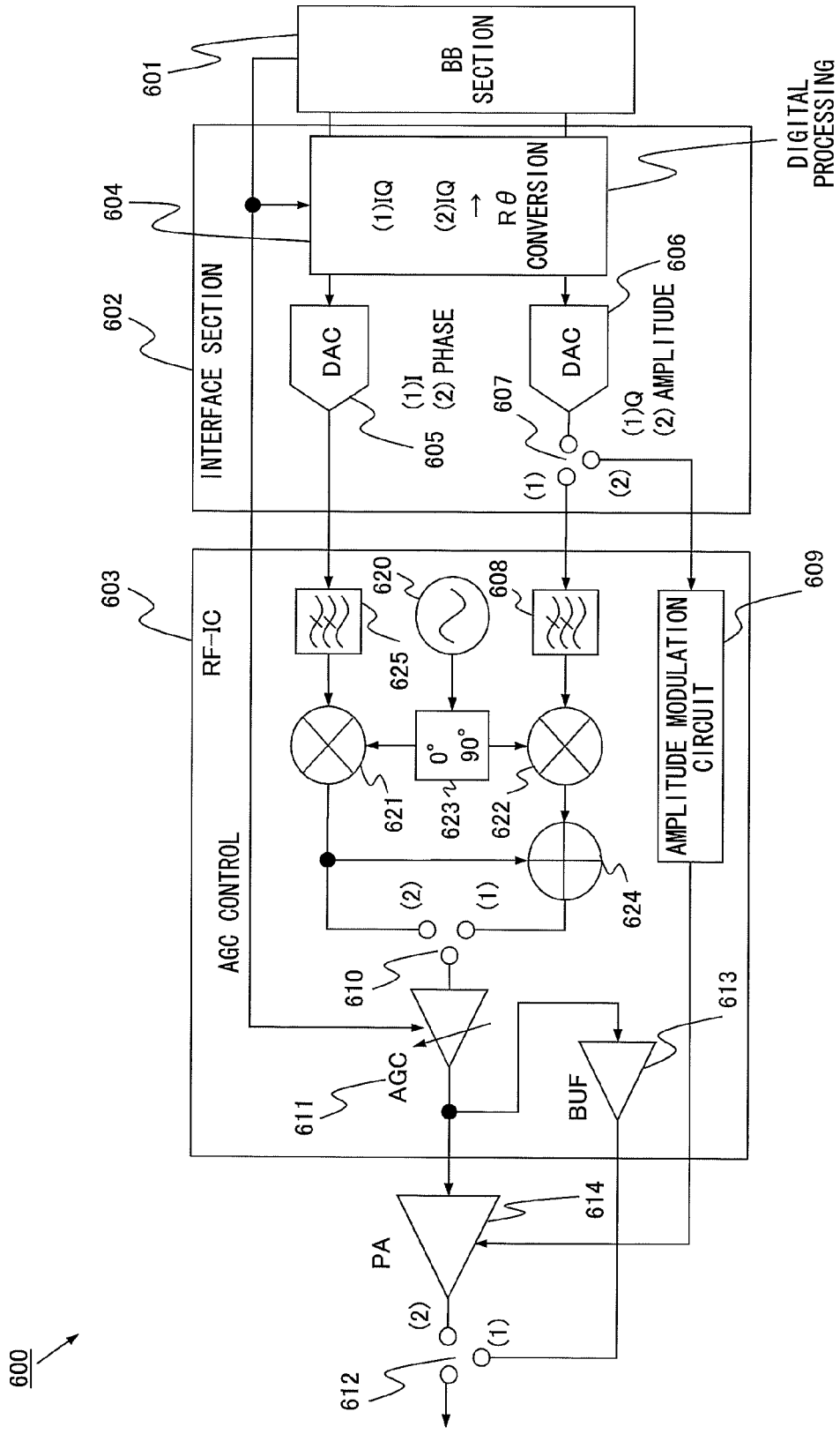
FIG. 7 shows a conventional transmitter circuit.

FIG. 6 is a block diagram showing an example of the configuration of a communication apparatus according to the fourth embodiment of the present invention. The communication apparatus 410 of the fourth embodiment includes a transmitter circuit 400, a receiver circuit 401, an antenna duplexer section 402, and an antenna 403. The transmitter circuit 400 is the transmitter circuit according to any one of the first to third embodiments. The antenna duplexer section 402 transmits a transmission signal outputted from the transmitter circuit 400, to the antenna 403, and prevents the transmission signal from leaking into the receiver circuit 401. In addition, the antenna duplexer section 402 transmits a reception signal inputted from the antenna 403, to the receiver circuit 401, and prevents the reception signal from leaking into the transmitter circuit 400.

Therefore, a transmission signal is outputted from the transmitter circuit 400, and then discharged to the outside from the antenna 403 via the antenna duplexer section 402. The reception signal is received by the antenna 403, and then received by the receiver circuit 401 via the antenna duplexer section 402. It is noted that the communication apparatus 410 may include only the transmitter circuit 400 and the antenna 403.

In this way, the communication apparatus 410 according to the present embodiment reduces the power consumption on transmission and reduces the cost of the apparatus by using the transmitter circuits according to the first to third embodiments. In addition, the transmitter circuit according to the present invention is applicable to communication apparatuses such as a mobile terminal or a wireless LAN.

INDUSTRIAL APPLICABILITY

The present invention is useful for transmitter circuits used in, for example, wireless communication systems such as a mobile phone or a wireless LAN, and more particularly, the present invention is useful for reducing the power consumption and reducing the circuit scale.

DESCRIPTION OF THE REFERENCE CHARACTERS 100, 200, 400, 300, 600 transmitter circuit
101, 201, 301 digital processing section
102, 202, 302 signal conversion section
103, 104, 203, 204, 303, 304 DAC
105, 106, 108, 205, 206, 305, 306 switch
107, 207, 351, 352, 353, 354 oscillation section
109, 110, 209, 210, 309, 310 mixer
111 phase shifter
112, 212, 312 adder
113, 213, 313 VGA
114, 214, 314 regulator
115, 215, 315 power amplifier
121, 221, 361, 362, 363, 364 oscillator
122, 216, 217, 371, 372, 373, 374, 375, 376, 377, 378 frequency divider
123, 223, 323 carrier wave generation section
181, 281, 381 mixer section
401 receiver circuit
402 antenna duplexer section
403 antenna
410 communication apparatus
601 BB section
602 interface section
603 RF-IC
604 Rθ conversion section
605, 606 DAC
607, 610, 612 switch
608, 625 baseband filter
609 amplitude modulation circuit
611 AGC amplifier
613 output buffer
614 power amplifier
620 oscillator
621, 622 mixer
623 phase shifter
624 adder

The invention claimed is:

1. A transmitter circuit that performs two modulation methods of a polar modulation method and a quadrature modulation method, and generates a transmission signal by a designated modulation method, the transmitter circuit comprising:
a signal conversion section for, in the polar modulation method, converting input data into an amplitude-component signal and a phase-component signal, and in the quadrature modulation method, converting input data into an in-phase component signal and a quadrature component signal;
a carrier wave generation section for outputting a carrier wave corresponding to the designated modulation method;
a mixer section for, in the quadrature modulation method, generating a quadrature modulation signal from the carrier wave, the in-phase component signal, and the quadrature component signal;
a regulator for, in the polar modulation method, outputting a supply voltage control signal in accordance with the amplitude-component signal; and
a power amplifier for, in the polar modulation method, amplifying the supply voltage control signal and superimposing the resultant signal onto the carrier wave, thereby generating the transmission signal, wherein
in the polar modulation method, the phase-component signal is inputted to the carrier wave generation section, and the carrier wave generation section outputs the carrier wave that has been modulated with respect to phase component, and
in the quadrature modulation method, the carrier wave generation section outputs the carrier wave that is yet to be modulated.

2. The transmitter circuit according to claim 1, wherein the carrier wave generation section includes:
an oscillation section for generating an oscillation signal corresponding to the designated modulation method;
a phase shifter for, in the quadrature modulation method, distributing and phase-shifting the oscillation signal, and outputting the resultant signals as the carrier wave that is yet to be modulated, to the mixer section; and
a switch for, in the polar modulation method, outputting the oscillation signal as the carrier wave that has been modulated with respect to phase component, to the power amplifier, and for, in the quadrature modulation method, connecting the oscillation signal to the phase shifter, the oscillation section includes:
- an oscillator for, in the polar modulation method, generating a high-frequency signal that has been modulated with respect to phase component, based on the phase-component signal inputted to the carrier wave generation section, and for, in the quadrature modulation method, generating a high-frequency signal that is yet to be modulated; and
- a frequency divider having respective frequency division characteristics corresponding to the polar modulation method and the quadrature modulation method, and the frequency divider switches the frequency division characteristic in accordance with the designated modulation method and frequency-dividing the high-frequency signal, thereby generating the oscillation signal.

3. The transmitter circuit according to claim 1, wherein the carrier wave generation section
- includes an oscillation section for generating the carrier wave corresponding to the designated modulation method,
- in the quadrature modulation method, outputs the carrier wave to the mixer section, and
- in the polar modulation method, outputs the carrier wave to the power amplifier, the oscillation section includes:
- an oscillator for, in the polar modulation method, generating a high-frequency signal that has been modulated with respect to phase component, based on the phase-component signal inputted to the carrier wave generation section, and for, in the quadrature modulation method, generating a high-frequency signal that is yet to be modulated;
- a first frequency divider having a frequency division characteristic corresponding to the polar modulation method; and
- a second frequency divider having a frequency division characteristic corresponding to the quadrature modulation method, a distribution function, and a phase shifting function, the first frequency divider, in the polar modulation method, frequency-divides the high-frequency signal, thereby generating the carrier wave that has been modulated with respect to phase component, and in the quadrature modulation method, does not operate, and the second frequency divider, in the quadrature modulation method, frequency-divides the high-frequency signal, distributes and phase-shifts the resultant signal, thereby generating the carrier wave that is yet to be modulated, and in the polar modulation method, does not operate.

4. The transmitter circuit according to claim 3, wherein the transmitter circuit is a multiband supporting transmitter circuit for generating a transmission signal while switching a band among a plurality of predetermined bands, in accordance with a designation, and the carrier wave generation section
- includes a plurality of the oscillation sections which output the carrier waves respectively corresponding to the plurality of bands, and
- of the plurality of the oscillation sections, the oscillation section that corresponds to a designated band outputs the carrier wave, and the oscillation sections that do not correspond to the designated band do not output the carrier waves.

5. The transmitter circuit according to claim 4, whether or not to output the carrier wave from each of the plurality of oscillation sections is controlled by supply or shutoff of power to the first frequency divider and the second frequency divider included in each of the plurality of oscillation sections.

6. A communication apparatus comprising:
- a transmitter circuit for generating a transmission signal; and
- an antenna for outputting the transmission signal generated by the transmitter circuit,
- wherein the transmitter circuit is the transmitter circuit according to claim 1.

7. The communication apparatus according to claim 6, further comprising:
- a receiver circuit for processing a reception signal received from the antenna; and
- an antenna duplexer section for outputting the transmission signal generated by the transmitter circuit to the antenna, and outputting the reception signal received from the antenna, to the receiver circuit.

* * * * *